INVENTOR
JOSEPH BATTISTA
BY
ATTORNEY

Feb. 21, 1967 J. BATTISTA 3,305,704

POWER SUPPLY HEAT SINK

Filed June 26, 1964

3 Sheets-Sheet 2

Feb. 21, 1967 J. BATTISTA 3,305,704

POWER SUPPLY HEAT SINK

Filed June 26, 1964

3 Sheets-Sheet 3

United States Patent Office 3,305,704
Patented Feb. 21, 1967

3,305,704
POWER SUPPLY HEAT SINK
Joseph Battista, Chicago, Ill., assignor to International Telephone and Telegraph Corporation, New York, N.Y., a corporation of Maryland
Filed June 26, 1964, Ser. No. 378,381
3 Claims. (Cl. 317—100)

This invention relates to heat sinks and more particularly to heat sinks for use in transistorized power supplies.

Recently, power supplies have been transistorized. However, this has caused problems because high temperatures are generated in power supplies, and semiconductor material cannot withstand high temperatures. Thus, it is common practice to mount the semiconductor devices on heat sinks (massive metal mounts having good heat conducting characteristics). Sometimes the heat sinks are provided with fins positioned in a cooling stream of air which facilitates the dissipation of the heat.

While these heat sinks have functioned very well, they have also presented some practical problems. For one thing, it has been necessary to disassemble the heat sink to replace a semiconductor device. For another thing, there has been an unfavorable ratio of air reaching the heat sink relative to the volume of the power supply. Yet another problem has centered on the manner in which the power supply may be expanded incrementally to provide an output which matches the needs of any desired circuitry.

Accordingly, an object of the invention is to provide new and improved power supplies. In this connection, an object is to provide extremely compact power supplies which, nevertheless, provide a maximum heat dissipation. Still another object is to provide modular power supplies having easily replaceable semiconductor devices.

In accordance with an aspect of this invention, a power supply is formed by a number of drawers which slide into a cabinet. Each drawer is a module which adds a predetermined increment of output capacity to the power supply. Thus, the power supply is given a greater or lesser capacity by adding or subtracting drawers. One end of the drawer is shaped to support and house the electrical components of the power supply The other end of the drawer is shaped to cooperate with the cabinet walls to form at least one wall of an air duct A number of finned heat sinks are pivotally mounted on the drawer wall to swing on the pivot from one to another position. In one position, the heat sink is athwart the air stream in the duct when the drawer is in position in the cabinet. In the other position, the heat sink is exposed for maintenance when the drawer is removed from the cabinet.

The above mentioned and other objects of this invention and the manner of obtaining them will become more apparent, and the invention itself will be best understood by reference to the following description of an embodiment of the invention taken in conjunction with the accompanying drawings, in which.

Figure 1:
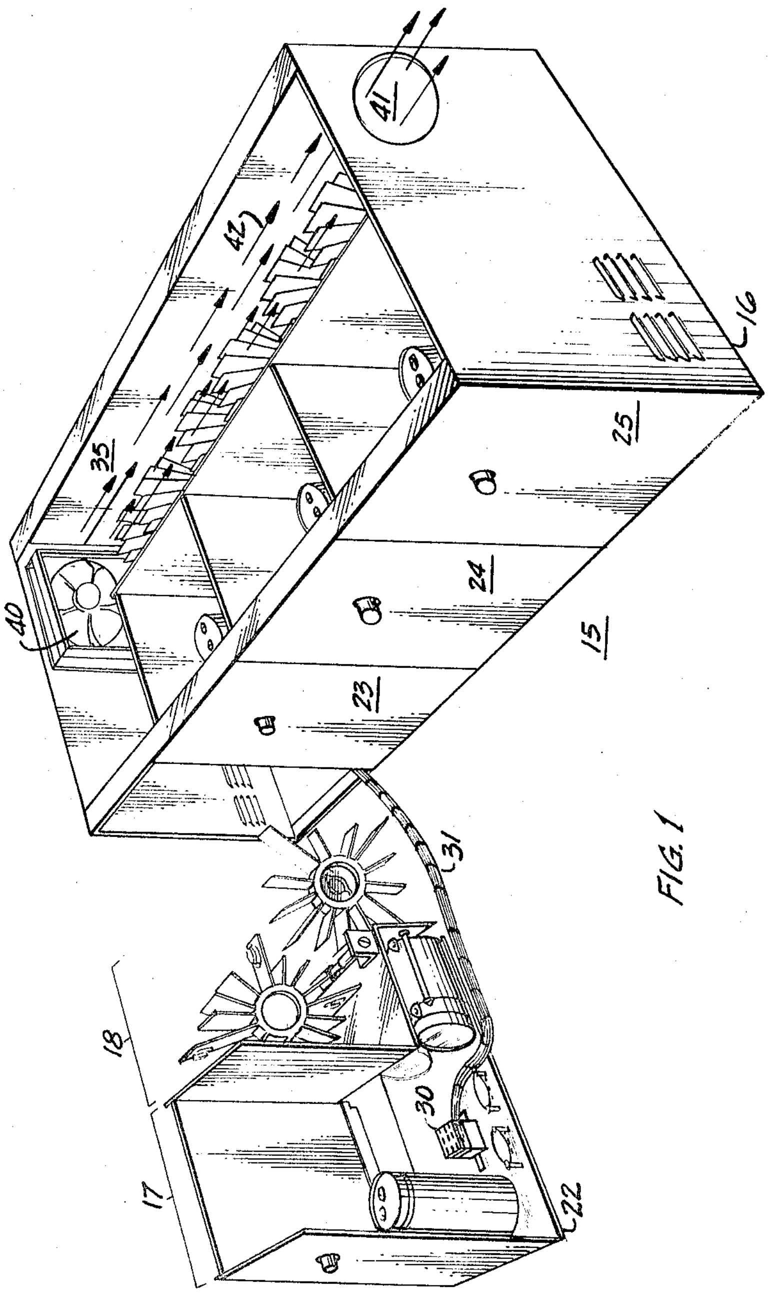
FIG. 1 is a perspective view of a power supply with one drawer removed and one heat sink in an operate position and the other heat sink in a maintenance position.

A power supply 15 (FIG. 1) comprises a cabinet 16 having a plurality of drawers slidably mounted therein. Generally speaking, electrical components are mounted on one end 17 of the drawer and finned heat sinks are mounted on the other end 18 of the drawer. One of the drawers 22 is shown as removed from the cabinet, perhaps for maintenance purposes. Three other drawers 23, 24, 25 are shown as slid into the cabinet in an operate position. Each drawer is a module which adds a predetermined amount of output capacity to the power supply.

Figure 2:
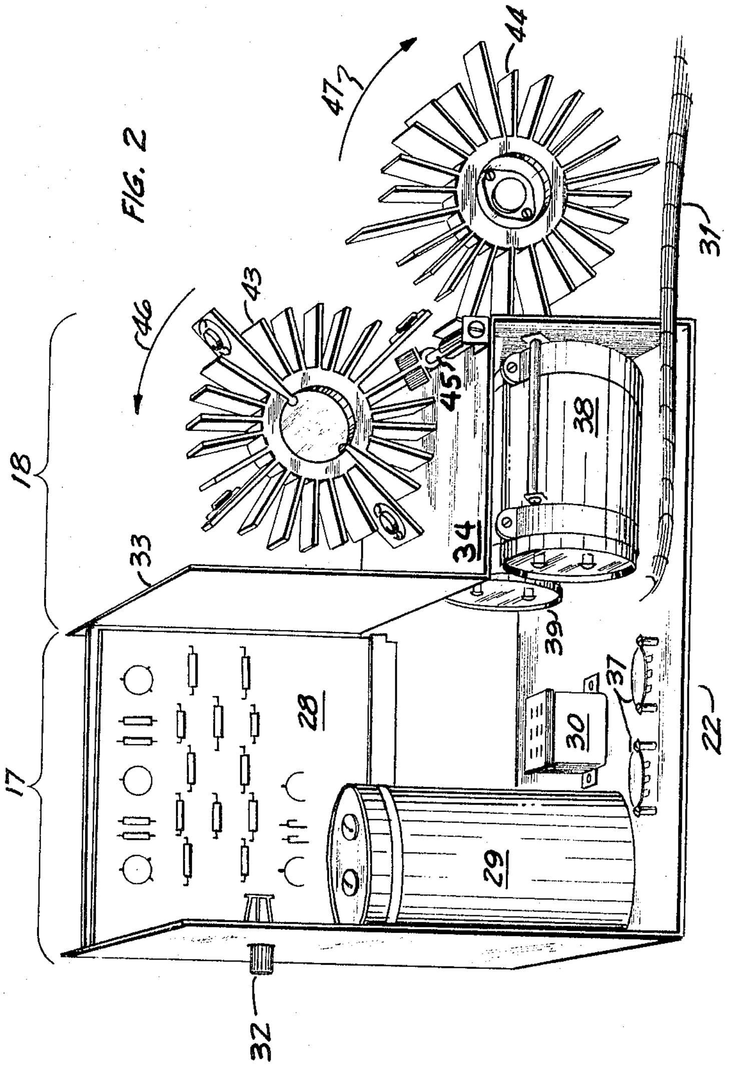
FIG. 2 is a perspective view of a drawer module of the power supply.

While any suitable components may be mounted in the drawer in any convenient manner, the invention contemplates a printed circuit card 28 (FIG. 2) mounting for small components and chassis mounting for large components (such as 29). A suitable connector 30 allows the drawer 22 to be removably connected to the cabinet 16 via a cable 31. The cable should be designed to allow the drawer to slide into and out of the cabinet 15. Any components which must be immediately accessible or visible are mounted on the front of the drawer, as at 32. This component is here shown as a fuse; however, it could be a lamp, knob, dial or the like.

The end 17 of the drawer is preferably shaped to house and support the electrical components while the other end 18 is shaped to form at least one wall of an air duct. However, the invention allows great flexibility and is not necessarily restricted to any particular configuration. To emphasize this flexibility, the components 29, 30, 37 are shown at the end 17 and the components 38, 39 are shown at the end 18. Alternatively, the connector 30 could be a jack field located at the end of the drawer so that connections are made to the power supply when the drawer is pushed into a home position inside the cabinet.

Means are provided for forming an air duct to cool the heat sinks when the drawers are in position. More particularly, plates 33, 34 are two sides of an air duct; the other two sides are the cabinet back 35 and top (not shown) in FIG. 1. A fan 40 (FIG. 1) is positioned in one end of the air duct, and a window 41 is cut into the cabinet at the other end of the air duct. Thus, the fan forces air to flow into the cabinet through the duct and around the fins to cool the heat sinks, and then out the window 41. For example, arrows such as 42, symbolize the air stream. Suitable filters may be located at each end of the duct to clean the air passing through the duct.

Any convenient number of finned heat sinks are pivotally mounted on the drawer wall 34 (FIG. 2) that is in the air duct. The exemplary construction in the drawing shows two heat sinks 43, 44 pivotally mounted on axle 45 to swing between operate and maintenance positions. Thus, the heat sink 43 is shown as having been swung in the direction of the arrow 46 to the position which it occupies while the power supply is in operation. The heat sink 44 is shown as having been swung in the direction of the arrow 47 to the maintenance position.

Figures 3, 4:
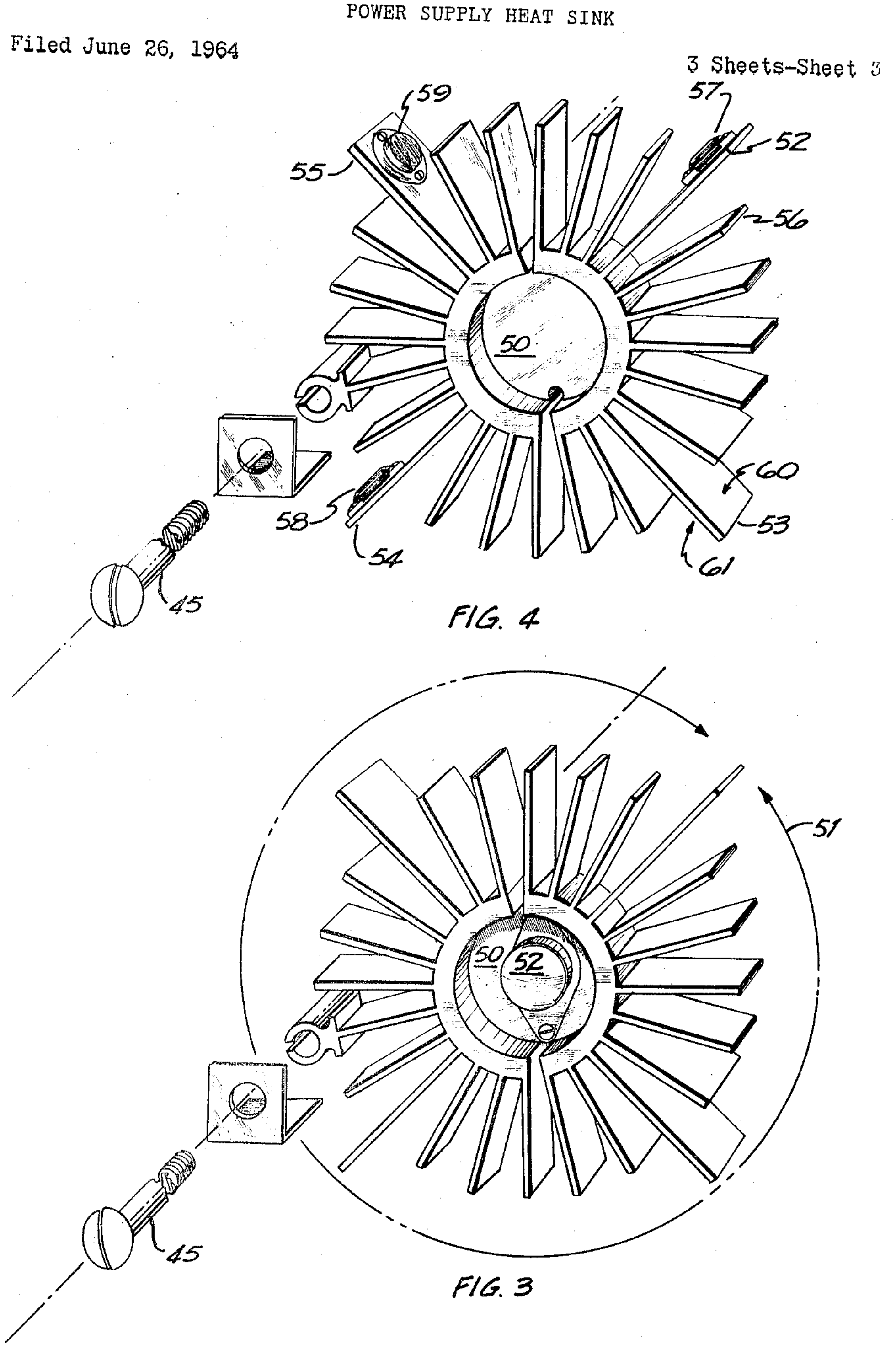
FIG. 3 shows a heat sink with a semiconductor device mounted in one optional position.
FIG. 4 shows a heat sink with a plurality of semiconductor devices mounted in other optional positions.

The configuration of the finned heat sink is seen best in FIGS. 3, 4. It has a hub-like central portion 50 with a number of spoke-like fins 51 radiating therefrom. In one exemplary construction, the heat sinks were extruded aluminum forms. They provide a number of optional positions for mounting semiconductor devices which may be selected depending upon the cooling needs of any given semiconductor. Thus, a large device 52 which is likely to generate much heat is mounted in the hub or center 50 of the heat sink, as shown in FIG. 3. This way, all of the fins (such as 51) are devoted to a dissipation of heat from the center of the heat sink.

By inspection, it should be apparent that some of the fins are longer than other of the fins, e.g. fins 52, 53, 54, 55 are longer than fin 56. The extended length of the long fins provide an exposed surface for mounting components. Thus, smaller components, which generate less heat, are mounted on the tips of the fins, as shown in FIG. 4. The semiconductor devices 57 and 58 are shown as mounted on the sides of fins 52, 54 which are exposed when the heat sink is in a maintenance position. The device 59 is shown as mounted on the side of fin 55 which is exposed when the heat sink is in an operate position. The arrows 60, 61 are intended to indicate that any device may be mounted on either side of any fin. It is a matter of convenience in any given construction.

While the principles of the invention have been described above in connection with specific apparatus and applications, it is to be understood that this description is made only by way of example and not as a limitation on the scope of the invention.

I claim:

1. A power supply comprising a cabinet for slidably supporting at least one drawer, one end of said drawer being shaped to support and house electrical components, the other end of said drawer being shaped to cooperate with said cabinet to form an air duct, at least one heat sink movably mounted on the other end of said drawer to move between an operate and a maintenance position, and means for pivotally mounting said heat sink on said drawer to swing between said operate and said maintenance positions, when said drawer is in said cabinet and said heat is in said operate position said heat sink lies athwart a stream of air in said duct.

2. A power supply comprising a cabinet for slidably supporting a plurality of drawers in side-by-side relation, each drawer supporting and housing electrical components, at least a portion of said drawer being shaped to cooperate with the walls of said cabinet to form an air duct, and a plurality of heat sinks pivotally mounting on each of said drawers to swing between operate and maintenance positions, when said drawers are in said cabinet and said heat sinks are in said operate position said heat sink being athwart the stream of air in said duct.

3. The power supply of claim 2 wherein each of said heat sinks comprises a central hub-like portion having a number of spoke-like fins radiating therefrom, some of said fins being longer than other of said fins, whereby said central portion and said long fins provide alternative mounting positions, and at least one semiconductor device mounted on each of said heat sinks in at least one of the alternative positions.

References Cited by the Examiner

FOREIGN PATENTS

| | | |
|---|---|---|
| 1,046,199 | 12/1958 | Germany. |
| 376,978 | 6/1964 | Switzerland. |

OTHER REFERENCES

Electronic Design, vol. 12, No. 3, Feb. 3, 1964, the inside of the front cover page.

ROBERT K. SCHAEFER, *Primary Examiner.*

W. C. GARVERT, *Assistant Examiner.*